(12) United States Patent
Chen et al.

(10) Patent No.: US 12,068,227 B2
(45) Date of Patent: *Aug. 20, 2024

(54) STRUCTURES AND METHODS FOR REDUCING PROCESS CHARGING DAMAGES

(71) Applicant: Taiwan Semiconductor Manufacturing Co., Ltd., Hsinchu (TW)

(72) Inventors: Kuan-Jung Chen, Hsin-Chu (TW); Cheng-Hung Wang, Hsin-Chu (TW); Tsung-Lin Lee, Hsin-Chu (TW); Shiuan-Jeng Lin, Hsinchu (TW); Chun-Ming Lin, Hsin-Chu (TW); Wen-Chih Chiang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/196,988

(22) Filed: May 12, 2023

(65) Prior Publication Data

US 2023/0282552 A1 Sep. 7, 2023

Related U.S. Application Data

(63) Continuation of application No. 17/336,220, filed on Jun. 1, 2021, now Pat. No. 11,688,666, which is a
(Continued)

(51) Int. Cl.
*H01L 23/48* (2006.01)
*H01L 21/02* (2006.01)
(Continued)

(52) U.S. Cl.
CPC ...... *H01L 23/481* (2013.01); *H01L 21/02532* (2013.01); *H01L 21/02595* (2013.01);
(Continued)

(58) Field of Classification Search
CPC ............. H01L 23/481; H01L 21/02532; H01L 21/02595; H01L 21/31116;
(Continued)

(56) References Cited

U.S. PATENT DOCUMENTS 6,133,610 A 10/2000 Bolam et al.
8,624,349 B1 * 1/2014 Blair .................. H01L 29/0649
257/501
(Continued)

*Primary Examiner* — J. E. Schoenholtz
(74) *Attorney, Agent, or Firm* — Duane Morris LLP

(57) ABSTRACT

Structures and methods for reducing process charging damages are disclosed. In one example, a silicon-on-insulator (SOI) structure is disclosed. The SOI structure includes: a substrate, a polysilicon region and an etch stop layer. The substrate includes: a handle layer, an insulation layer arranged over the handle layer, and a buried layer arranged over the insulation layer. The polysilicon region extends downward from an upper surface of the buried layer and terminates in the handle layer. The etch stop layer is located on the substrate. The etch stop layer is in contact with both the substrate and the polysilicon region.

20 Claims, 21 Drawing Sheets

Related U.S. Application Data continuation of application No. 16/675,702, filed on Nov. 6, 2019, now Pat. No. 11,031,320.

(60) Provisional application No. 62/773,695, filed on Nov. 30, 2018.

(51) Int. Cl.
| | |
|---|---|
| *H01L 21/311* | (2006.01) |
| *H01L 21/762* | (2006.01) |
| *H01L 21/768* | (2006.01) |
| *H01L 23/528* | (2006.01) |
| *H01L 23/532* | (2006.01) |
| *H01L 23/58* | (2006.01) |
| *H01L 29/06* | (2006.01) |

(52) U.S. Cl.
CPC .. *H01L 21/31116* (2013.01); *H01L 21/76283* (2013.01); *H01L 21/76802* (2013.01); *H01L 21/76877* (2013.01); *H01L 23/528* (2013.01); *H01L 23/53257* (2013.01); *H01L 23/53271* (2013.01); *H01L 23/585* (2013.01); *H01L 29/0649* (2013.01)

(58) Field of Classification Search
CPC ......... H01L 21/76283; H01L 21/76802; H01L 21/76877; H01L 23/528; H01L 23/53257; H01L 23/53271; H01L 23/585; H01L 29/0649; H01L 21/763; H01L 21/743; H01L 21/7624; H01L 21/76897; H01L 23/5386

See application file for complete search history.

(56) References Cited

U.S. PATENT DOCUMENTS

| | | | |
|---|---|---|---|
| 11,031,320 B2* | 6/2021 | Chen | H01L 23/481 |
| 11,688,666 B2* | 6/2023 | Chen | H01L 21/76877 257/508 |
| 2002/0043686 A1 | 4/2002 | Bolam et al. | |
| 2010/0096699 A1 | 4/2010 | Miyata | |
| 2015/0340448 A1 | 11/2015 | Babcock et al. | |

* cited by examiner

STRUCTURES AND METHODS FOR REDUCING PROCESS CHARGING DAMAGES

CROSS-REFERENCE TO RELATED APPLICATIONS

This application is a continuation of U.S. patent application Ser. No. 17/336,220, filed Jun. 1, 2021, which is a continuation of U.S. patent application Ser. No. 16/675,702, filed on Nov. 6, 2019, now U.S. Pat. No. 11,031,320, which claims priority to U.S. Provisional Patent Application No. 62/773,695, filed on Nov. 30, 2018, each of which is incorporated by reference herein in their entireties.

BACKGROUND

Deep trench capacitors and transistors can be used as memory elements in semiconductor structures or integrated circuits. A wafer with deep trenches, e.g. a silicon-on-insulator (SOI) wafer with deep trenches, is susceptible to process charging damage which causes a big yield loss. Based on an existing SOI wafer structure, a contact (e.g. metal-semiconductor contact) is not electrically connected with the polysilicon in the deep trench (DT) in the substrate. As such, the process charging cannot be released to and through the substrate and is accumulated in the p-type substrate layer (or Si layer) and the buried oxide layer of the SOI substrate.

Thus, existing semiconductor structures and methods to handle process charging are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
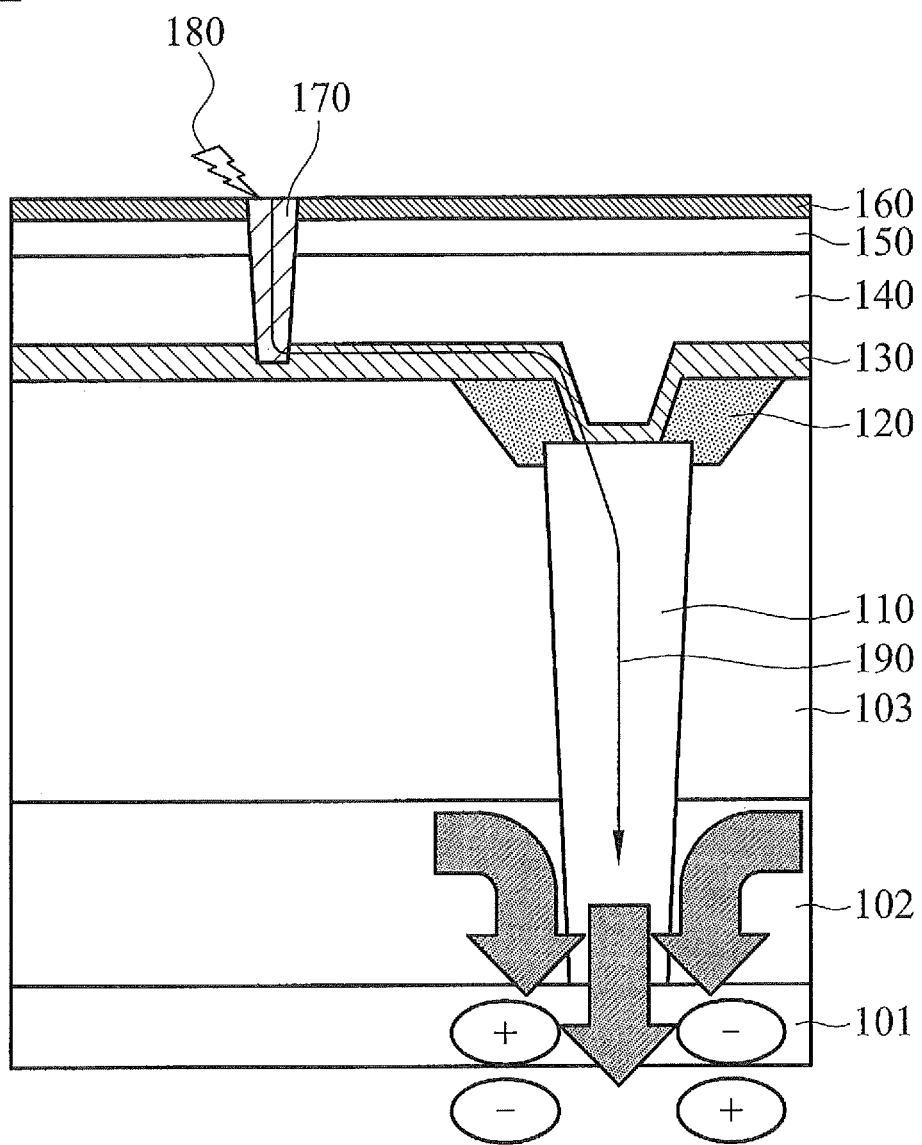
FIG. 1 illustrates a cross-sectional view of an exemplary silicon-on-insulator (SOI) structure for reducing process charging damages, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

To reduce process charging damage of a wafer, the present disclosure provides various embodiments having a contact etch stop layer (CESL) formed on and in contact with a deep trench (DT) polysilicon in the substrate of the wafer. The CESL electrically connects metal contacts of the wafer with the DT polysilicon. As such, the process charging can be released through the contact, the CESL, and the deep trench polysilicon, into the substrate, and/or released out of the substrate through the handle silicon layer of the substrate.

In one embodiment, a shallow trench isolation (STI) above the DT polysilicon is etched to form an opening in a chip region (or a core circuit region) of a wafer to allow the CESL to be in contact with the DT polysilicon directly. This structure enables the process charging to be released into the substrate (or a handle layer of an SOI substrate) through the CESL and the DT polysilicon. In a seal ring region of the wafer, an extra contact may be added to land right above the DT polysilicon and on the CESL. In this case, a shorter CESL path is formed to release the process charging more easily to the substrate through the added contact, the CESL, and the DT polysilicon.

In one embodiment, a disclosed wafer is formed by the following operations. An SOI substrate is formed. A deep trench extending downward into the SOI substrate to a handle layer of the SOI substrate is filled with polysilicon. An STI on the deep trench polysilicon is filled with oxide material. The STI oxide is etched to expose at least a portion of the upper surface of the deep trench polysilicon. A CESL is deposited onto the SOI substrate and in contact with the exposed deep trench polysilicon. At least one contact is formed on and in contact with the CESL. Optionally in addition to (or among) the at least one contact, an extra contact lands right over the DT polysilicon and on the CESL. In one embodiment, the exposed upper surface of the deep trench polysilicon is larger than a size of a typical contact for the extra contact to land on.

Compared to an existing wafer structure, the disclosed wafer structure reduces process charging damages, and thus improves the wafer yield gain and revenue. The present disclosure is applicable to any semiconductor structure with a deep trench, and any technologies with an SOI process. In the present disclosure, the terms "charging" and "process charging" may be interchangeably used.

FIG. 1 illustrates a cross-sectional view of an exemplary silicon-on-insulator (SOI) structure 100 for releasing process charging, in accordance with some embodiments of the present disclosure. As shown in FIG. 1, the SOI structure 100 includes a SOI substrate having a handle layer 101, an insulation layer 102 arranged over the handle layer 101, and a buried layer 103 arranged over the insulation layer 102. In one embodiment, both the handle layer 101 and the buried layer 103 include silicon, while the insulation layer 102 includes oxide, e.g. silicon dioxide, as an insulator or barrier between the handle layer 101 and the buried layer 103.

As shown in FIG. 1, the SOI structure 100 includes a polysilicon region 110 extending downward through the buried layer 103 and the insulation layer 102, and terminating in the handle layer 101. The SOI structure 100 further includes an isolation layer 120 located on the polysilicon region 110. In one embodiment, both the polysilicon region 110 and the isolation layer 120 may serve as isolators between chips on a wafer. While the polysilicon region 110 is formed in a first trench, the isolation layer 120 is formed in a second trench that is on the first trench. The first trench (called deep trench) is deeper than the second trench (called shallow trench). In one embodiment, the polysilicon region 110 includes polysilicon that has high electric conductivity while the isolation layer 120 includes oxide material that has low or no electric conductivity.

As shown in FIG. 1, the SOI structure 100 further includes an etch stop layer 130 located on the substrate 101, 102, 103. The etch stop layer 130 in this example is in contact with both the substrate and the polysilicon region 110. The isolation layer 120 has an opening through which the etch stop layer 130 is in contact with the polysilicon region 110. The etch stop layer 130 includes: at least one portion located at a bottom of the opening and in contact with the polysilicon region 110; and at least one portion extending along sidewalls of the opening and in contact with the isolation layer 120.

As shown in FIG. 1, the SOI structure 100 further includes at least one dielectric layer 140, 150, 160 on the etch stop layer 130. The SOI structure 100 in this example includes a first dielectric layer 140 formed on the etch stop layer 130, a second dielectric layer 150 formed on the first dielectric layer 140, and a third dielectric layer 160 formed on the second dielectric layer 150. Each of the dielectric layers 140, 150, 160 may include a dielectric material like: silicon oxynitride (SiON), polythene oxide (PE-Ox), etc.

The SOI structure 100 further includes at least one contact 170 extending through the at least one dielectric layer 140, 150, 160 and located on the etch stop layer 130. In one embodiment, the at least one contact 170 comprises metal material like tungsten. The etch stop layer 130 in this example may be a contact etch stop layer (CESL) where an etching process stops for forming the at least one contact 170. In one embodiment, the etch stop layer 130 may include material like silicon nitride.

In one embodiment, the SOI structure 100 further includes a metal layer (not shown in FIG. 1) over the at least one dielectric layer 140, 150, 160. The at least one contact 170 electrically connects the metal layer and the etch stop layer 130. As such, process charging 180 generated at the metal layer and/or the at least one contact 170 will be released to the handle layer 101 of the substrate via the route 190, i.e. through the at least one contact 170, the CESL 130, the polysilicon region 110, to the handle layer 101. In one embodiment, the polysilicon region 110 is in a core circuit region of a wafer to separate adjacent chips on the wafer.

Figure 2:
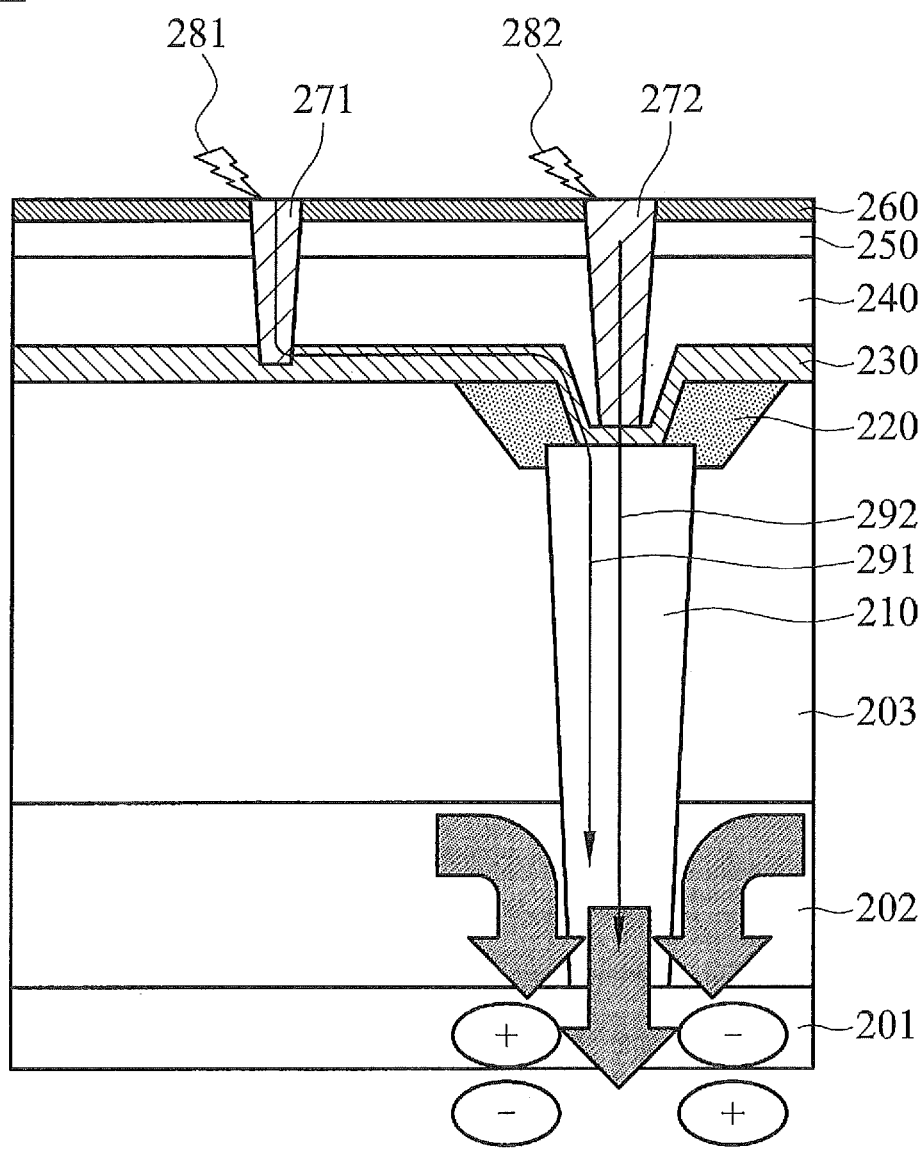
FIG. 2 illustrates a cross-sectional view of another exemplary SOI structure for reducing process charging damages, in accordance with some embodiments of the present disclosure.

FIG. 2 illustrates a cross-sectional view of another exemplary SOI structure 200 for releasing process charging, in accordance with some embodiments of the present disclosure. As shown in FIG. 2, the SOI structure 200 includes a SOI substrate having a handle layer 201, an insulation layer 202 arranged over the handle layer 201, and a buried layer 203 arranged over the insulation layer 202. The SOI structure 200 further includes a polysilicon region 210 extending downward through the buried layer 203 and the insulation layer 202, and terminating in the handle layer 201. The SOI structure 200 further includes an isolation layer 220 located on the polysilicon region 210, and an etch stop layer 230 located on the substrate and in contact with both the substrate and the polysilicon region 210. The isolation layer 220 has an opening through which the etch stop layer 230 is in contact with the polysilicon region 210. The SOI structure 200 also includes dielectric layers 240, 250, 260 on the etch stop layer 230.

As shown in FIG. 2, the SOI structure 200 includes a first contact 271 located on the etch stop layer 230 but not right above the polysilicon region 210; and the SOI structure 200 also includes a second contact 272 located on the etch stop layer 230 and right above the polysilicon region 210. That is, the second contact 272 extends into the opening of the isolation layer 220 above the polysilicon region 210. In one embodiment, the SOI structure 200 further includes a metal layer (not shown in FIG. 2) over the dielectric layers 240, 250, 260. Each of the first contact 271 and the second contact 272 electrically connects the metal layer and the etch stop layer 230. As such, process charging 281, 282 generated at the metal layer and/or the contacts 271, 272 can be released to the handle layer 201 of the substrate. To be specific, process charging 281 at the first contact 271 will be released to the handle layer 201 via the route 291, i.e. through the first contact 271, the etch stop layer 230, the polysilicon region 210, to the handle layer 201; and process charging 282 at the second contact 272 will be released to the handle layer 201 via the route 292, i.e. through the second contact 272, the etch stop layer 230, the polysilicon region 210, to the handle layer 201. Compared to the first contact 271, the second contact 272 can release process charging more easily into the handle layer 201 by a shorter route 292, since the second contact 272 lands right above the polysilicon region 210. In one embodiment, the polysilicon region 210 is in a seal ring region of a wafer to separate different dies on the wafer.

Figure 3A:
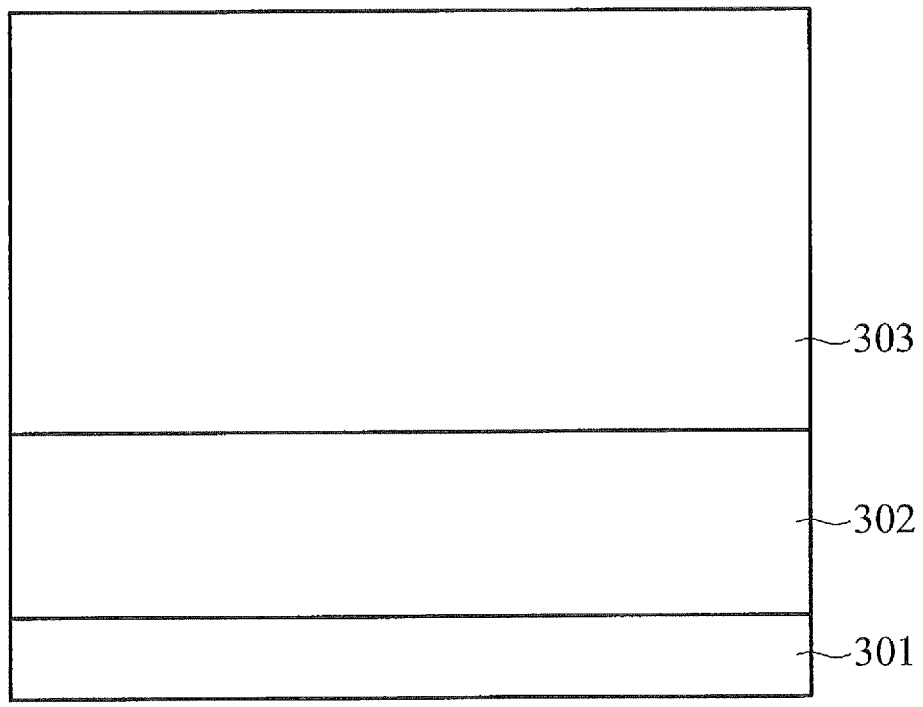
FIGS. 3A, 3B, 3C, 3D, 3E, 3F, 3G, 3H, 3I, 3J, 3K, 3L, 3M, 3N and 3O illustrate cross-sectional views of an exemplary SOI structure during various fabrication stages, in accordance with some embodiments of the present disclosure.

FIGS. 3A, 3B, 3C, 3D, 3E, 3F, 3G, 3H, 3I, 3J, 3K, 3L, 3M, 3N and 3O illustrate cross-sectional views of an exemplary SOI structure during various fabrication stages, in accordance with some embodiments of the present disclosure. In some embodiments, the SOI structure may include a substrate for a semiconductor device included in an integrated circuit (IC). FIGS. 3A through 3O are simplified for a better understanding of the concepts of the present disclosure. For example, the IC, in which the SOI structure is formed, may include a number of other devices comprising resistors, capacitors, transistors, inductors, fuses, etc., which are not shown in FIGS. 3A through 3O, for purposes of clarity of illustration.

FIG. 3A is a cross-sectional view of a SOI structure 300 including a SOI substrate, which is provided at one of the various stages of fabrication, according to some embodiments of the present disclosure. The SOI substrate in FIG. 3A may be formed by depositing an insulation layer 302 on a handle layer 301; and then a buried layer 303 on the insulation layer 302. In one embodiment, both the handle layer 301 and the buried layer 303 include silicon, while the insulation layer 302 includes oxide, e.g. silicon dioxide, as an insulator or barrier between the handle layer 301 and the buried layer 303.

Figure 3B:
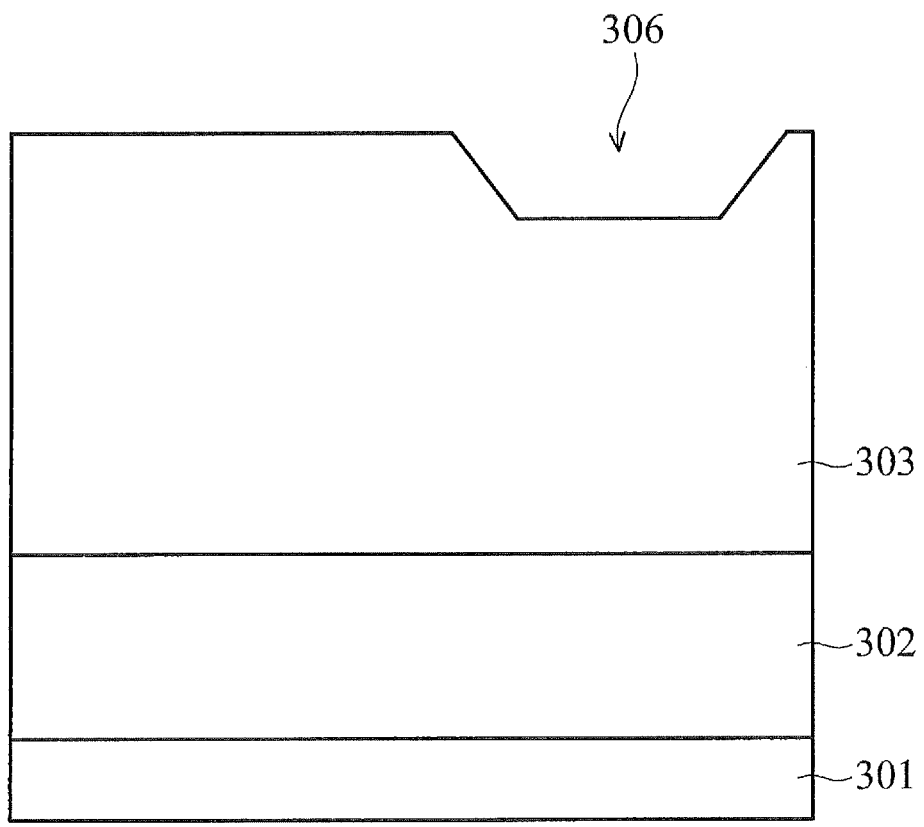

FIG. 3B is a cross-sectional view of the SOI structure 300 including a shallow trench 306, which is provided at one of the various stages of fabrication, according to some embodiments of the present disclosure. As shown in FIG. 3B, the shallow trench 306 is formed on the buried layer 303. In one embodiment, the shallow trench 306 is arranged at a location to separate adjacent chips of an IC to be formed on the SOI structure 300. In another embodiment, the shallow trench 306 is arranged at a location to separate different dies on a wafer of the SOI structure 300. According to some embodiments, the shallow trench 306 is formed by an etching process performed to remove portions of the buried layer 303. The etching process stops on the buried layer 303 with a mask oxide. In some embodiments, a cleaning process and/or a soft/hard baking process are performed following the etching process.

Figure 3C:
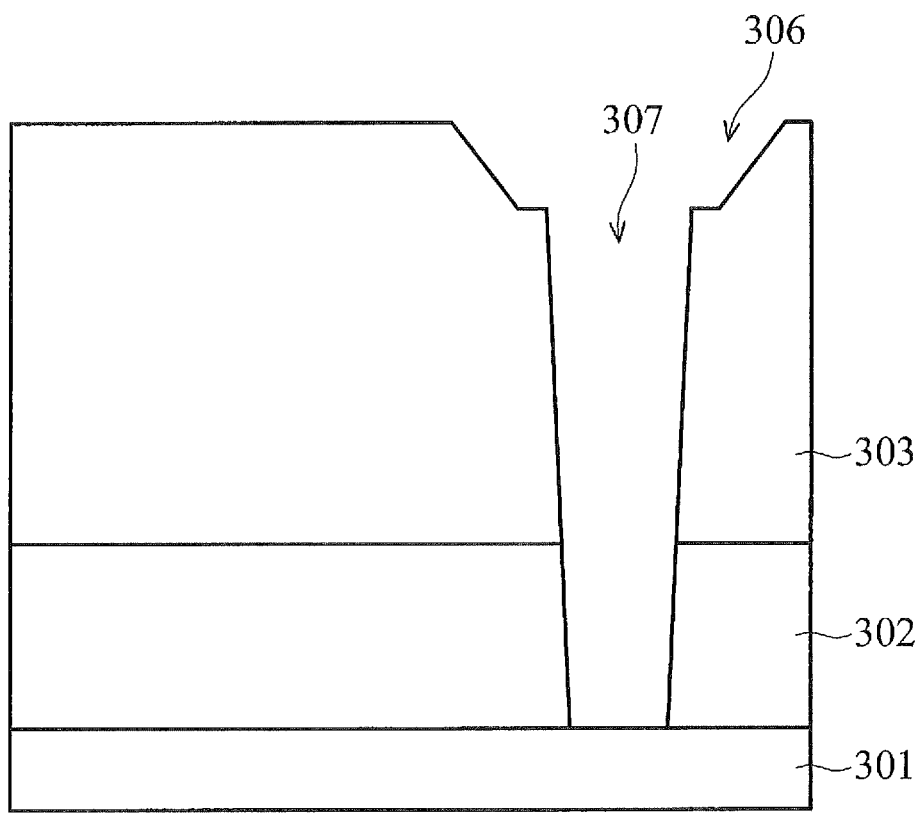

FIG. 3C is a cross-sectional view of the SOI structure 300 including a deep trench 307, which is provided at one of the various stages of fabrication, according to some embodiments of the present disclosure. As shown in FIG. 3C, the deep trench 307 extends from the bottom surface of the shallow trench 306 to the handle layer 301, through the buried layer 303 and the insulation layer 302. According to some embodiments, the deep trench 307 is formed by an etching process performed to remove portions of the buried layer 303 and the insulation layer 302. The etching process stops on the handle layer 301 with a mask oxide. In some embodiments, a cleaning process and/or a soft/hard baking process are performed following the etching process.

Figure 3D:
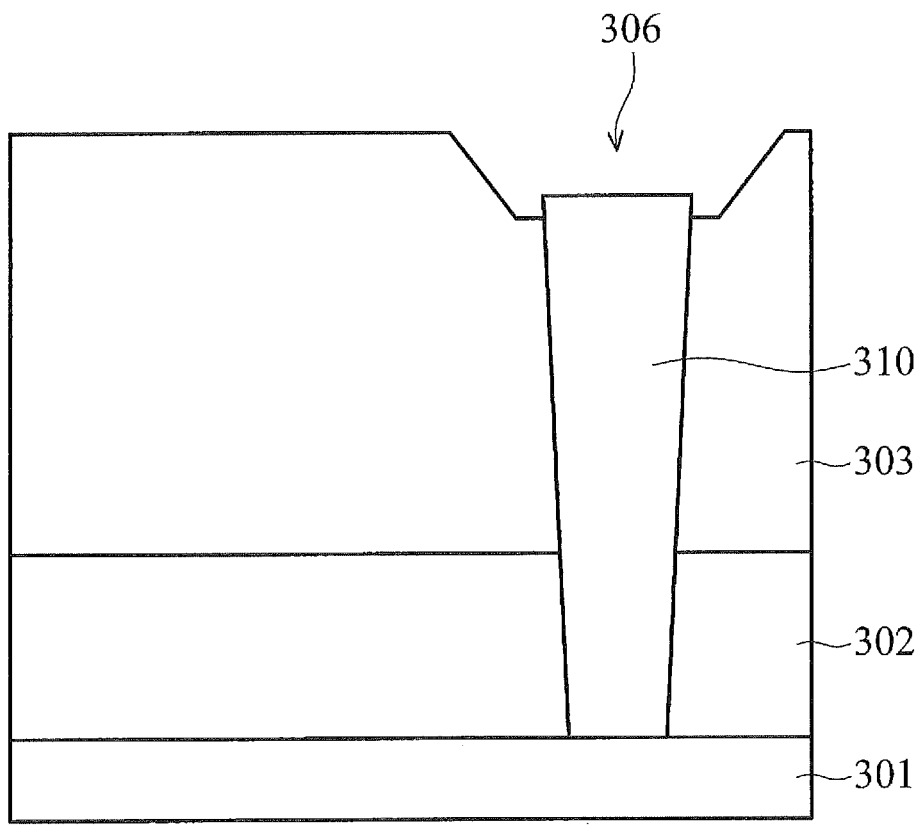

FIG. 3D is a cross-sectional view of the SOI structure 300 including a polysilicon region 310, which is provided at one of the various stages of fabrication, according to some embodiments of the present disclosure. In one embodiment, the polysilicon region 310 is formed by depositing polysilicon into the deep trench 307. The polysilicon region 310 may serve as a deep trench isolation for chips on the SOI structure 300.

Figure 3E:
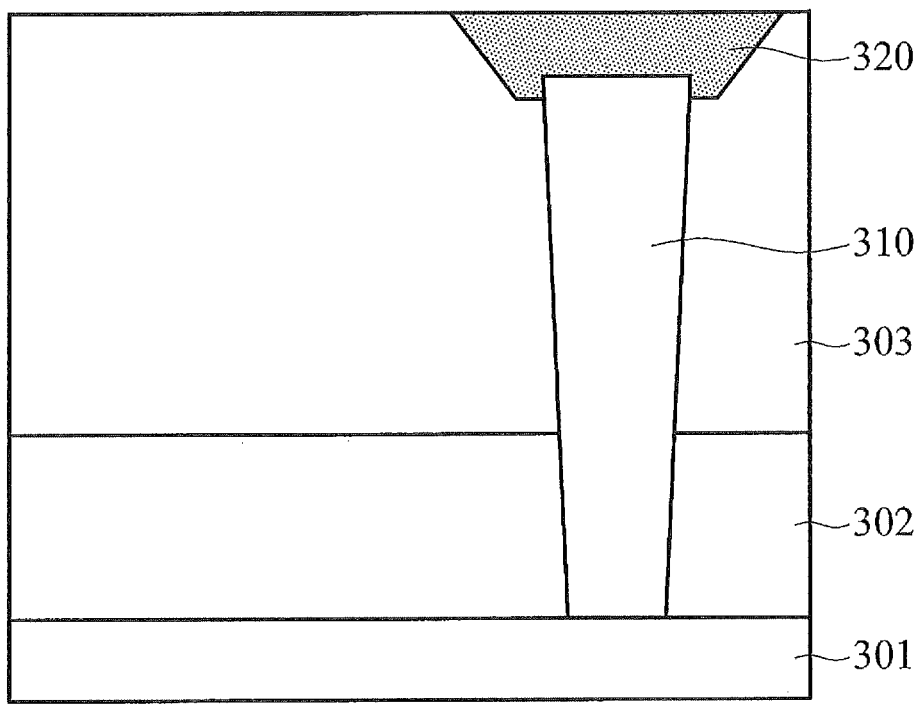

FIG. 3E is a cross-sectional view of the SOI structure 300 including a shallow trench isolation (STI) 320, which is provided at one of the various stages of fabrication, according to some embodiments of the present disclosure. As shown in FIG. 3E, the STI 320 is formed by depositing oxide material into the shallow trench 306.

Figure 3F:
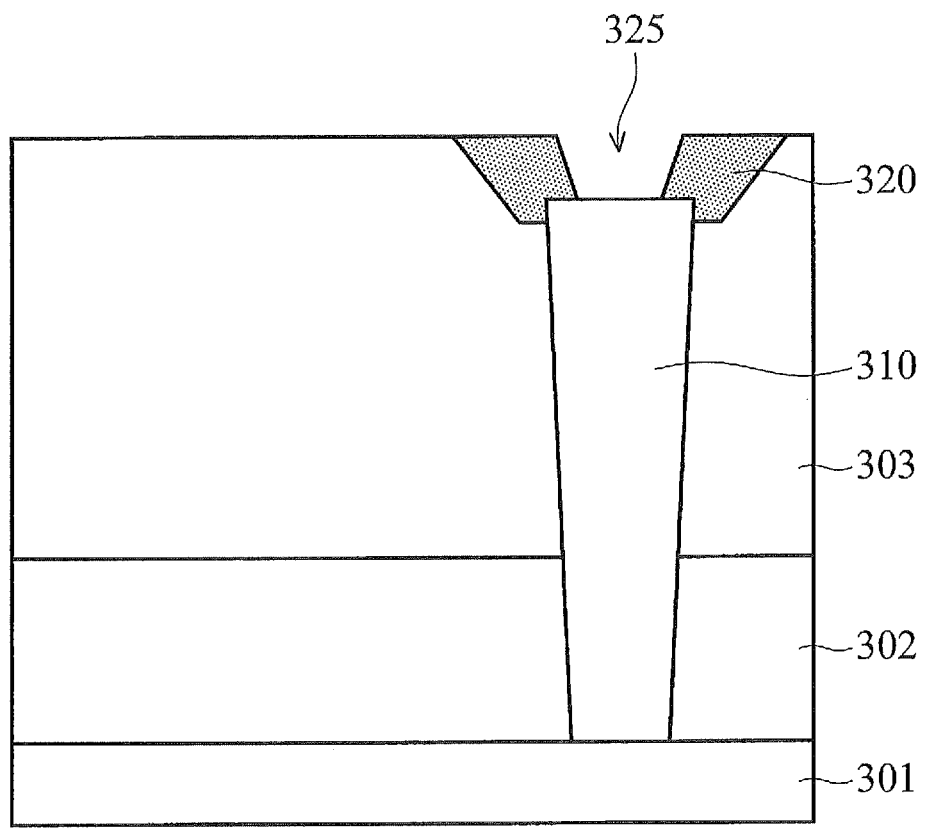

FIG. 3F is a cross-sectional view of the SOI structure 300 having an opening 325, which is provided at one of the various stages of fabrication, according to some embodiments of the present disclosure. As shown in FIG. 3F, the opening 325 is formed on the STI 320. According to some embodiments, the opening 325 is formed by an etching process performed to remove portions of the STI 320 above the polysilicon region 310. The etching process stops on the polysilicon region 310 with a mask oxide. In some embodiments, a cleaning process and/or a soft/hard baking process are performed following the etching process.

Figure 3G:
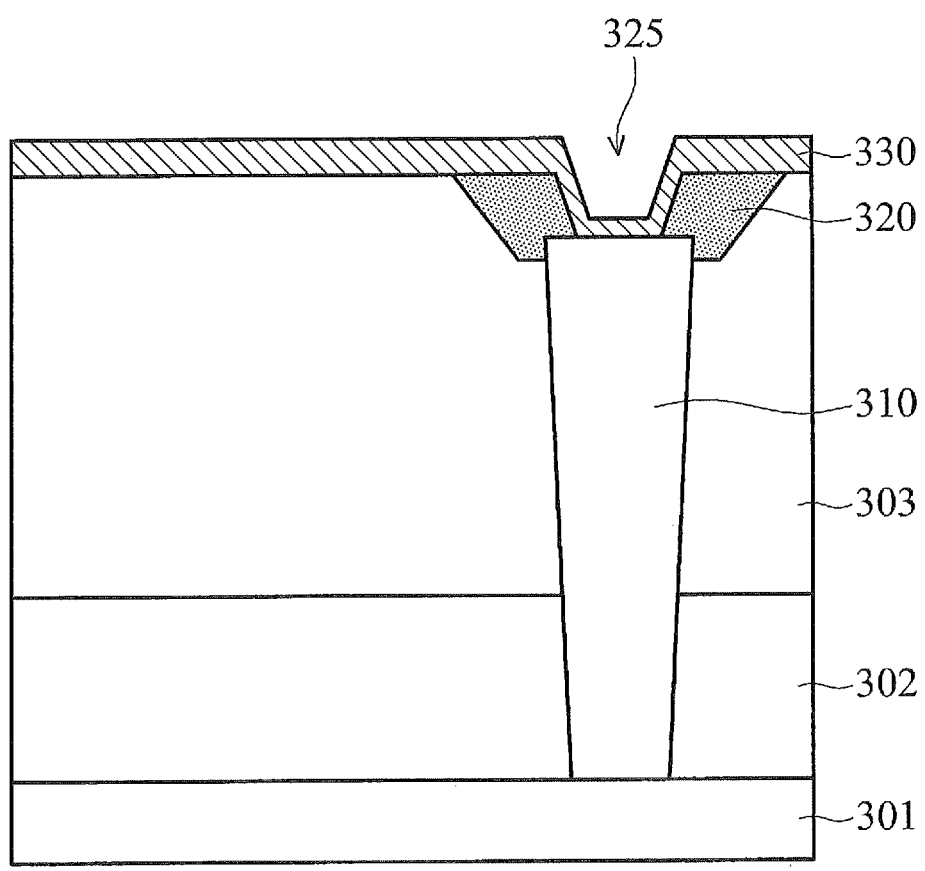

FIG. 3G is a cross-sectional view of the SOI structure 300 including a contact etch stop layer (CESL) 330, which is formed at one of the various stages of fabrication, according to some embodiments of the present disclosure. As shown in FIG. 3G, the CESL 330 has a profile that covers the top surface of the buried layer 303, the top surface of the STI 320, the sidewalls of the opening 325, and the bottom surface of the opening 325. In one embodiment, the CESL 330 may be formed by depositing silicon nitride following this profile. In one embodiment, the CESL 330 has a thickness value that is not too small to function as an etch stop layer and not bigger than necessary such that the conductivity of structure is degraded. In one embodiment, the CESL 330 has a thickness between 100 angstroms and 1000 angstroms, e.g. about 400 angstroms. As shown in FIG. 3G, at least part of the CESL 330 is formed on the bottom surface of the opening 325 and contacting the polysilicon region 310.

Figure 3H:
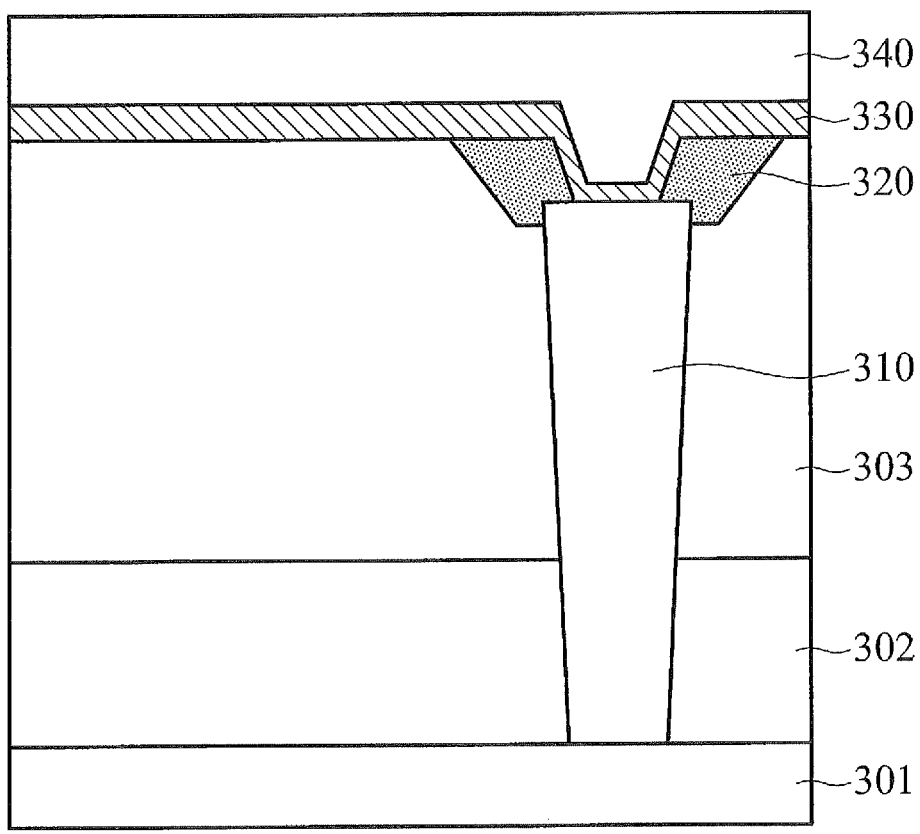

FIG. 3H is a cross-sectional view of the SOI structure 300 including a first dielectric layer 340, which may be an inter-layer dielectric (ILD) formed on the CESL 330 at one of the various stages of fabrication, according to some embodiments of the present disclosure. As shown in FIG. 3H, the first dielectric layer 340 is formed to fill the opening 325 and cover the CESL 330. The first dielectric layer 340 may be formed by depositing a dielectric material like silicon oxynitride (SiON) or polythene oxide (PE-Ox).

Figure 3I:
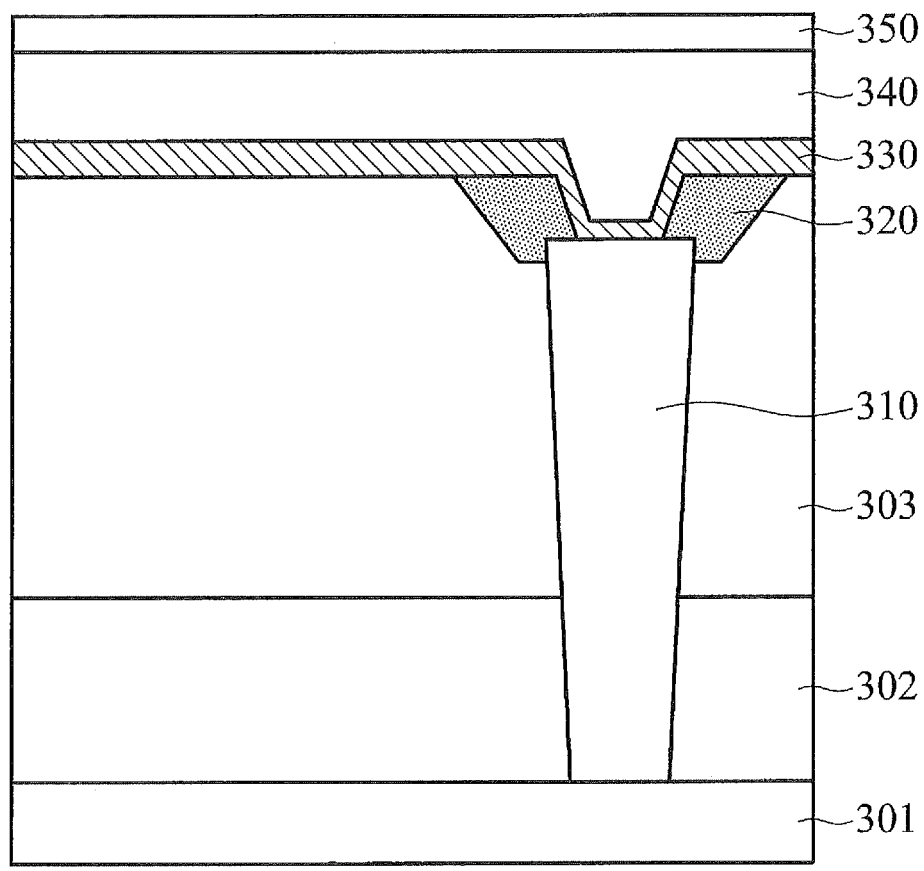

FIG. 3I is a cross-sectional view of the SOI structure 300 including a second dielectric layer 350, which is formed on the first dielectric layer 340 at one of the various stages of fabrication, according to some embodiments of the present disclosure. In one example, the second dielectric layer 350 may be formed by depositing a dielectric material like silicon oxynitride (SiON).

Figure 3J:
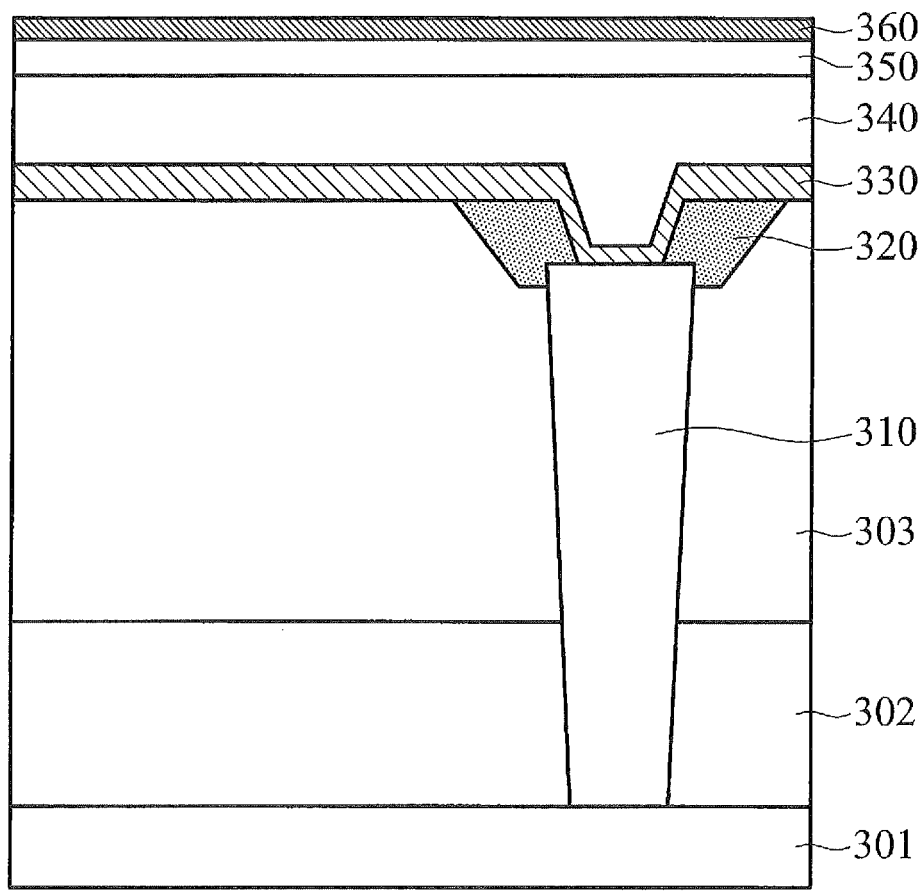

FIG. 3J is a cross-sectional view of the SOI structure 300 including a third dielectric layer 360, which is formed on the second dielectric layer 350 at one of the various stages of fabrication, according to some embodiments of the present disclosure. In one example, the third dielectric layer 360 may be formed by depositing a dielectric material like polythene oxide (PE-Ox).

Figure 3K:
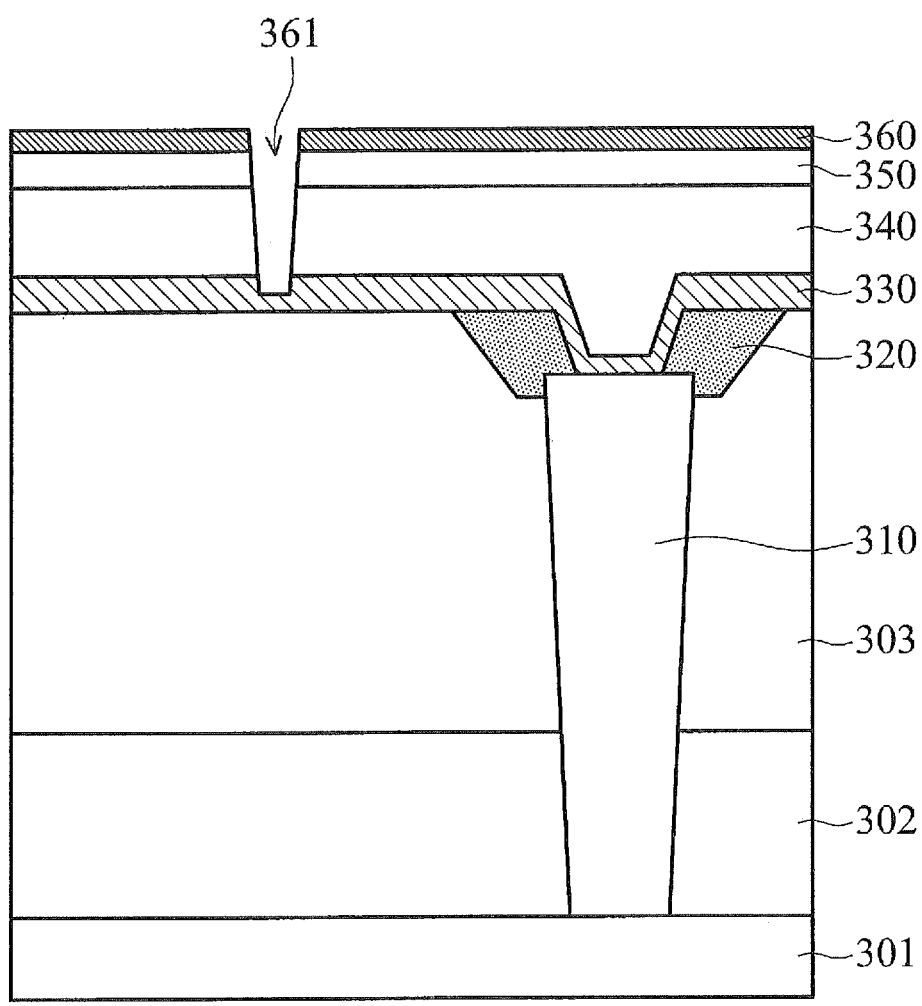

FIG. 3K is a cross-sectional view of the SOI structure 300 in which a first opening 361 is formed, at one of the various stages of fabrication, according to some embodiments of the present disclosure. According to some embodiments, an etching process, e.g. a dry etching process, is performed to remove portions of the third dielectric layer 360, the second dielectric layer 350 and the first dielectric layer 340 above the CESL 330. The etching process stops on the CESL 330. In some embodiments, a cleaning process and/or a soft/hard baking process are performed following the dry etching process. As shown in FIG. 3K, the first opening 361 is not formed right above the polysilicon region 310.

Figure 3L:
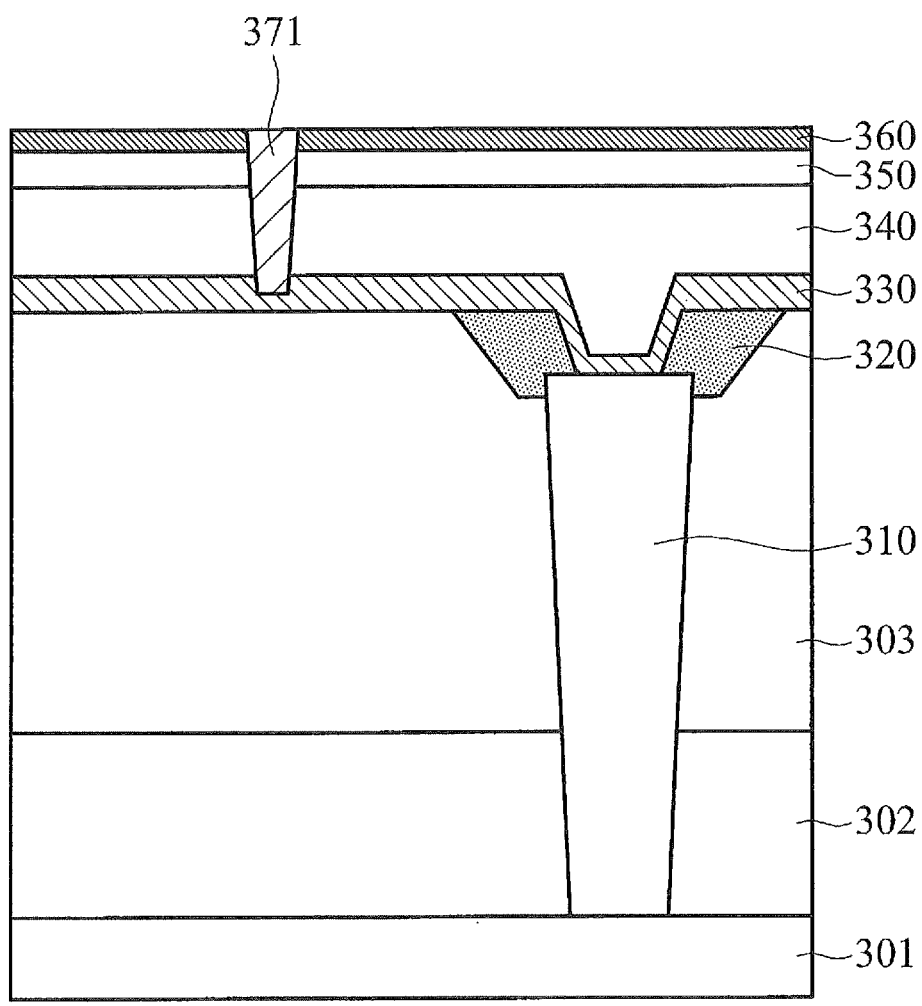

FIG. 3L is a cross-sectional view of the SOI structure 300 including a first contact 371, which is provided at one of the various stages of fabrication, according to some embodiments of the present disclosure. The first contact 371 in this example is formed by depositing metal material, e.g. tungsten, into the first opening 361.

Figure 3M:
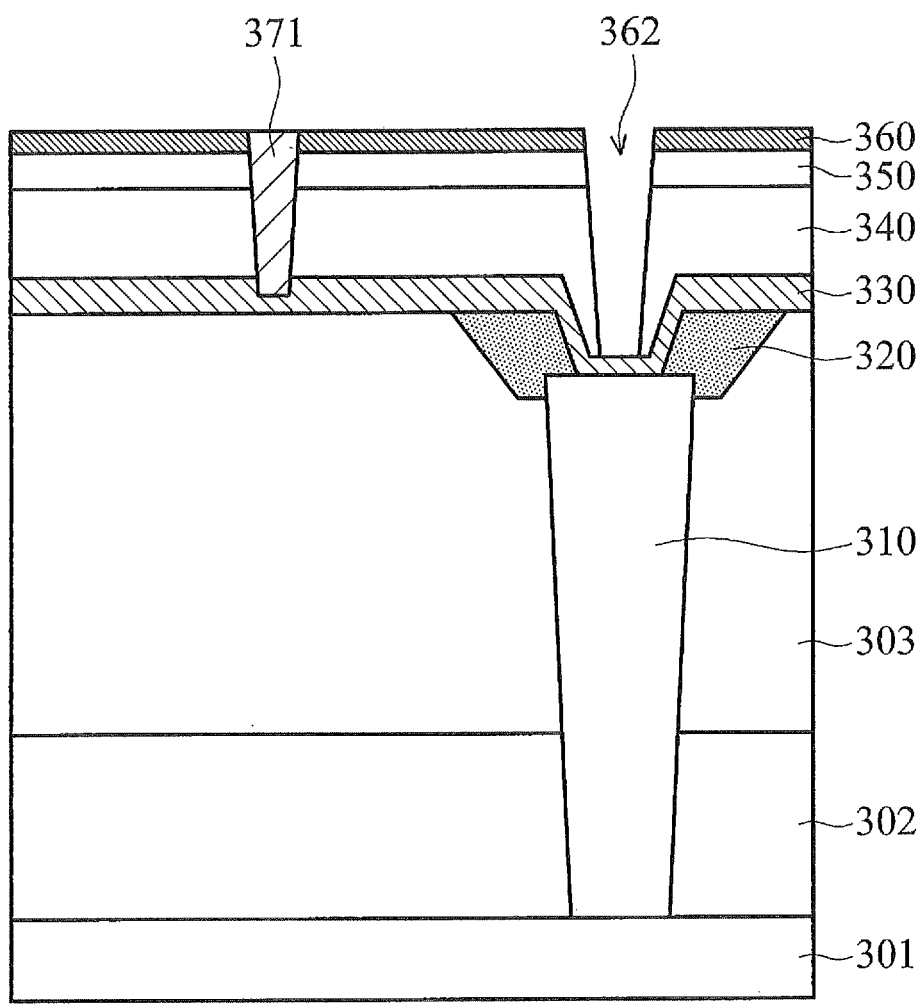

FIG. 3M is a cross-sectional view of the SOI structure 300 in which a second opening 362 is formed, at one of the various stages of fabrication, according to some embodiments of the present disclosure. According to some embodiments, an etching process, e.g. a dry etching process, is performed to remove portions of the third dielectric layer 360, the second dielectric layer 350 and the first dielectric layer 340 above the CESL 330. The etching process stops on the CESL 330. In some embodiments, a cleaning process and/or a soft/hard baking process are performed following the dry etching process. As shown in FIG. 3M, the second opening 362 is formed right above the polysilicon region 310.

Figure 3N:
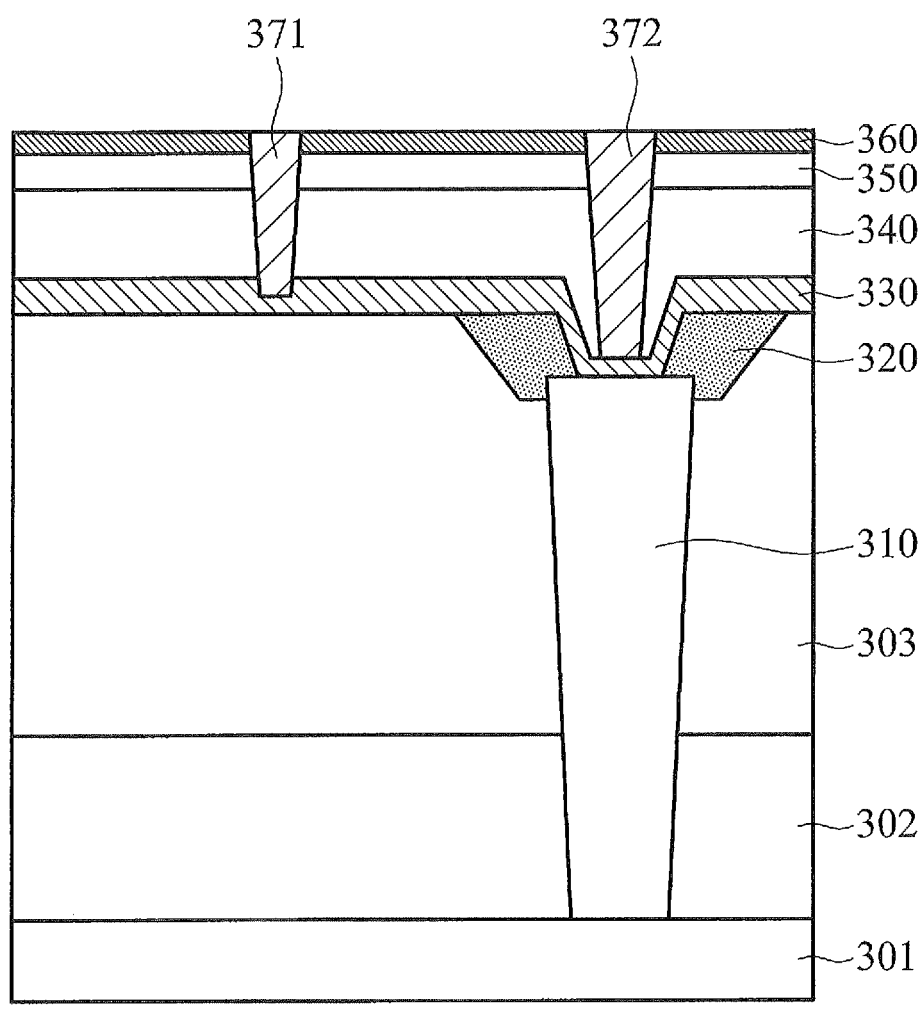
Figure 3O:
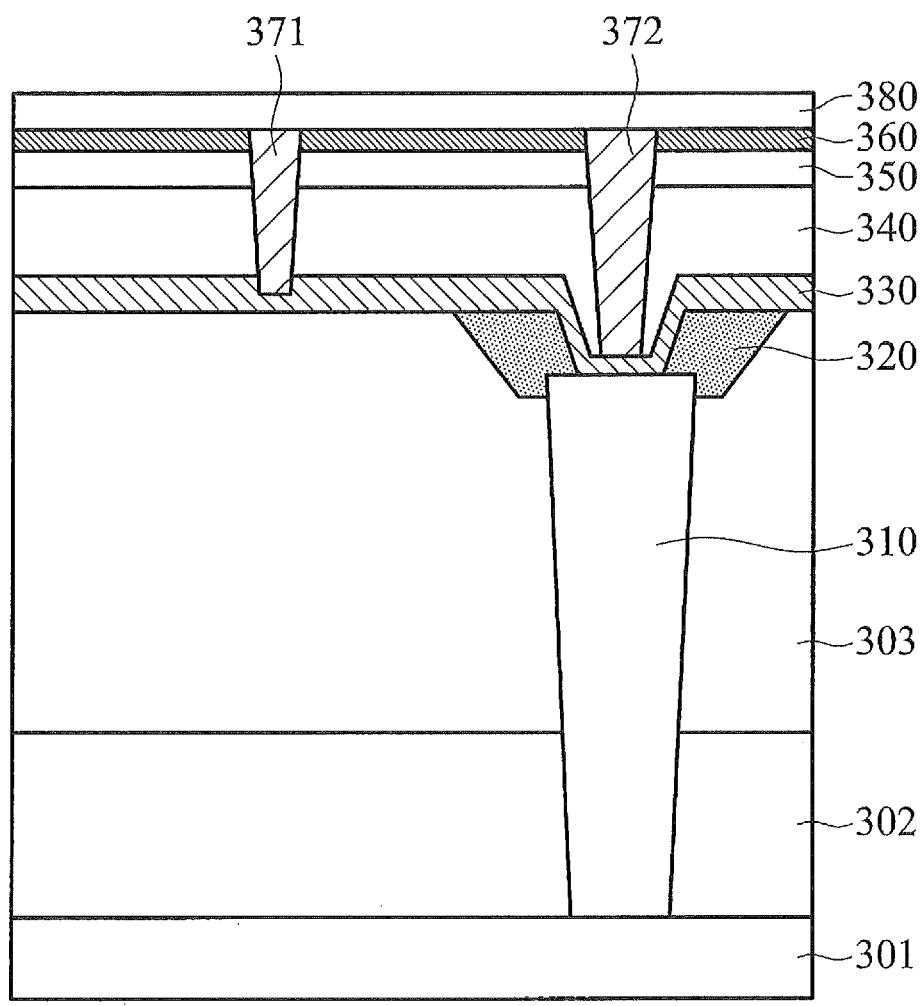

FIG. 3N is a cross-sectional view of the SOI structure 300 including a second contact 372, which is provided at one of the various stages of fabrication, according to some embodiments of the present disclosure. The second contact 372 in this example is formed by depositing metal material, e.g. tungsten, into the second opening 362. Since the second contact 372 is formed right above the polysilicon region 310, process charging may be released into the handle layer 301 of the substrate via a short path through the second contact 372, the portion of the CESL 330 right above the polysilicon region 310, and the polysilicon region 310. In one embodiment, while the portions of the first contact 371 and the second contact 372 that are above the substrate may be referred to as standard contacts, the portion of the second contact 372 that is in the substrate, i.e. in the opening 325, may be referred to as a substrate contact.

FIG. 3O is a cross-sectional view of the SOI structure 300 including a metal layer 380, which is provided at one of the various stages of fabrication, according to some embodiments of the present disclosure. As shown in FIG. 3O, the metal layer 380 is formed to cover the third dielectric layer 360, the first contact 371 and the second contact 372. The metal layer 380 may be formed by depositing a metal material like copper or aluminum. As such, each of the first contact 371 and the second contact 372 electrically connects the metal layer 380 to the CESL 330, to help releasing process charging and reducing process charging damages.

Figure 4:
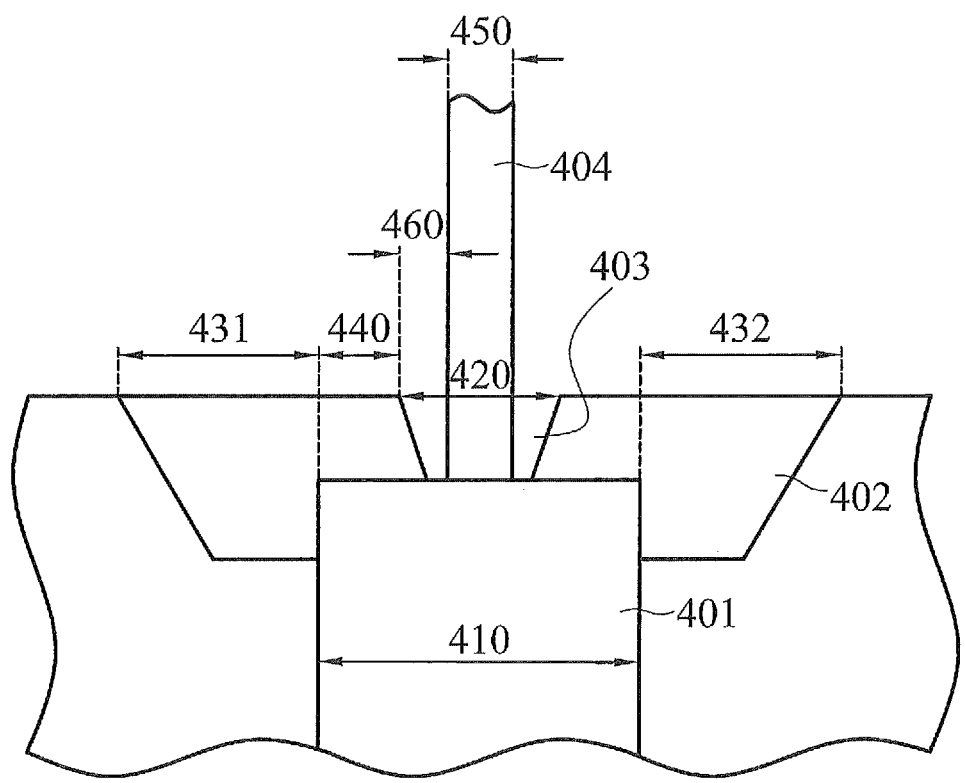
FIG. 4 illustrates a diagram of an exemplary SOI structure, in accordance with some embodiments of the present disclosure.

FIG. 4 illustrates a diagram of an exemplary SOI structure 400, in accordance with some embodiments of the present disclosure. In the illustrated embodiment of FIG. 4, dimensions of different components of the SOI structure 400 are shown. For example, the deep trench polysilicon 401 of the SOI structure 400 has a width 410. The STI 402 above the deep trench polysilicon 401 in this example has a left margin width 431 and a right margin width 432. The STI 402 has an opening 403 whose top width 420 is smaller than the width 410 of the deep trench polysilicon 401. Otherwise, if the width 420 is larger than the width 410, the etching process performed to form the opening 403 may etch deeper than necessary under the top surface of the deep trench polysilicon 401. Since the opening 403 may not always be formed exactly at the middle of the top surface of the deep trench polysilicon 401, it is preferred to have some margin width 440 at each side of the opening 403 on the top surface of the deep trench polysilicon 401.

As shown in FIG. 4, a contact 404 of the SOI structure 400 is formed right above the deep trench polysilicon 401 and lands on the bottom surface of the opening 403. The contact 404 has a width 450 that is smaller than the width 420 of the opening 403, leaving a margin width 460 at each side of the contact 404 compared to the sidewalls of the opening 403.

Figure 5:
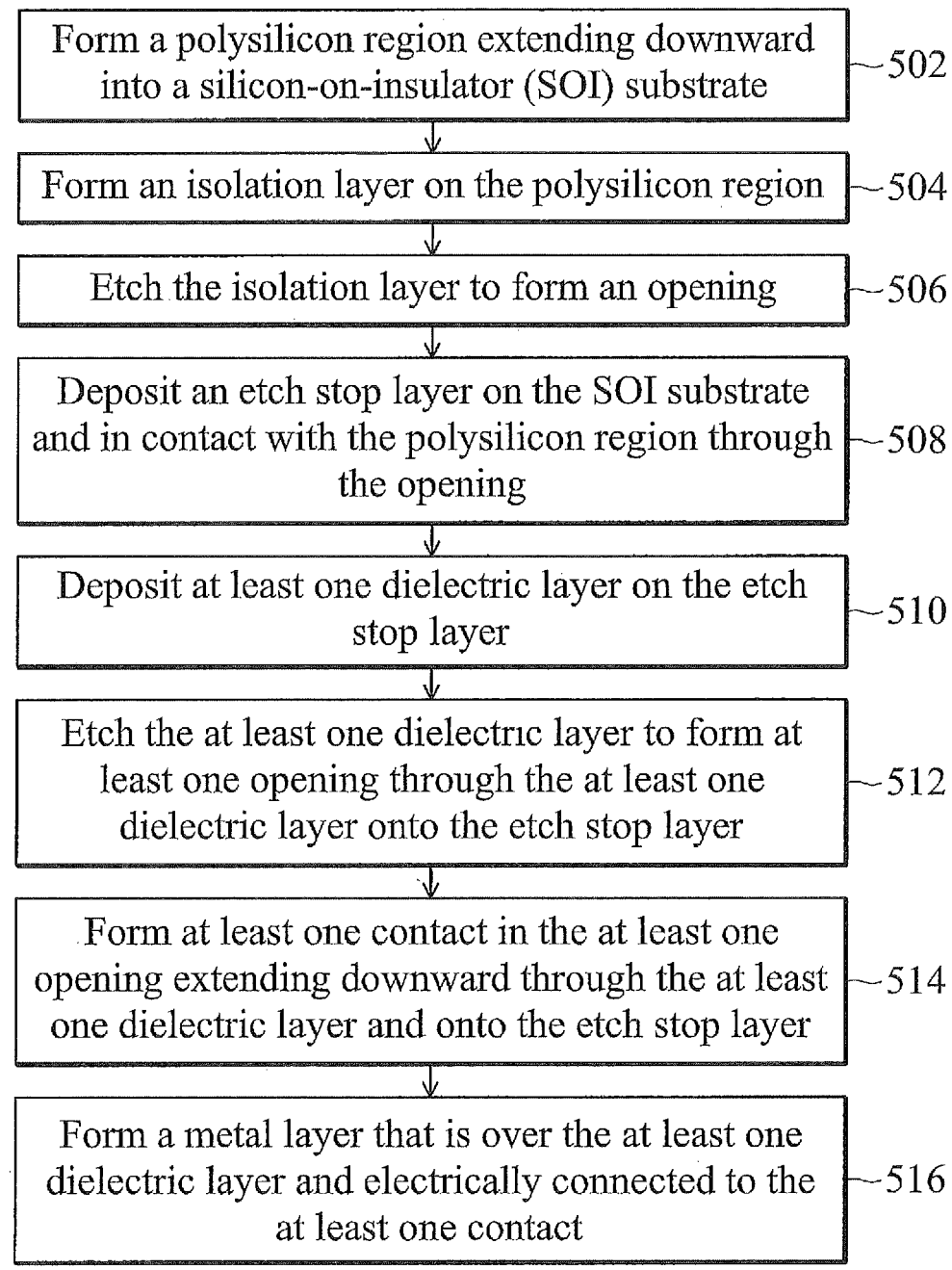
FIG. 5 shows a flow chart illustrating an exemplary method for forming a semiconductor structure, in accordance with some embodiments of the present disclosure.

FIG. 5 is a flow chart illustrating an exemplary method 500 for forming a semiconductor structure, in accordance with some embodiments of the present disclosure. At operation 502, a polysilicon region is formed extending downward into a silicon-on-insulator (SOI) substrate. An isolation layer is formed at operation 504 on the polysilicon region. The isolation layer is etched at operation 506 to form an opening. An etch stop layer is deposited at operation 508 on the SOI substrate and in contact with the polysilicon region through the opening. At least one dielectric layer is deposited at operation 510 on the etch stop layer. At operation 512, the at least one dielectric layer is etched to form at least one opening through the at least one dielectric layer onto the etch stop layer. At operation 514, at least one contact is formed in the at least one opening extending downward through the at least one dielectric layer and onto the etch stop layer. At operation 516, a metal layer is formed over the at least one dielectric layer. The metal layer is electrically connected to the at least one contact. The order of the operations shown in FIG. 5 may be changed according to different embodiments of the present disclosure.

Figure 6:
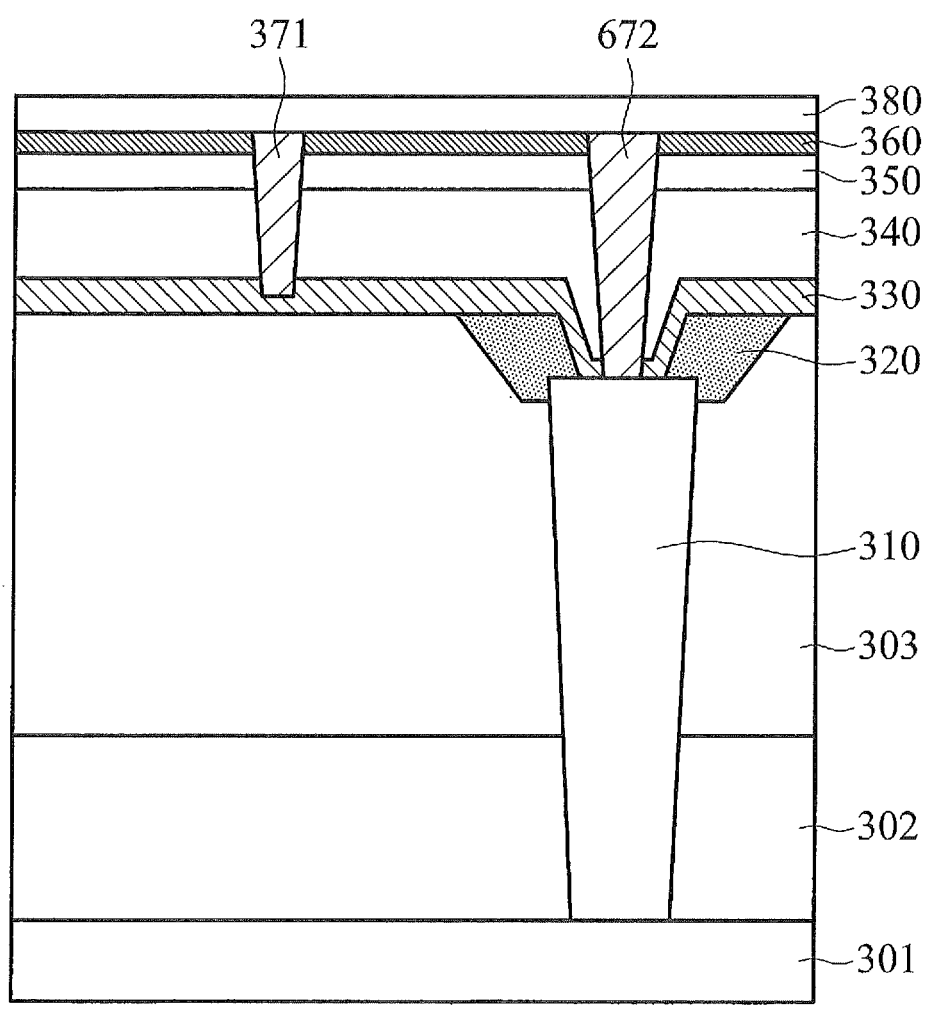
FIG. 6 illustrates a cross-sectional view of another exemplary SOI structure for reducing process charging damages, in accordance with some embodiments of the present disclosure.

FIG. 6 illustrates a cross-sectional view of another exemplary SOI structure 600 for reducing process charging damages, in accordance with some embodiments of the present disclosure. As shown in FIG. 6, the exemplary SOI structure 600 is similar to the SOI structure 200 described and illustrated with reference to FIG. 2 and the SOI structure 300 described and illustrated with reference to FIG. 3O, except that, for example, the SOI structure 600 includes a second contact 672 formed on and in direct contact with the polysilicon region 310. In one embodiment, the second contact 672 may be formed by first performing an etching process, e.g. a dry etching process, to remove portions of the third dielectric layer 360, the second dielectric layer 350, the first dielectric layer 340 and the CESL 330 to form an opening on the polysilicon region 310. The etching process stops on the polysilicon region 310. In some embodiments, a cleaning process and/or a soft/hard baking process are performed following the dry etching process. After the opening is formed, the second contact 672 may be formed by depositing metal material, e.g. tungsten, into the opening. In this structure, process charging may be released into the handle layer 301 of the substrate via a short path through the second contact 672 on the polysilicon region 310, and the polysilicon region 310.

Figure 7:
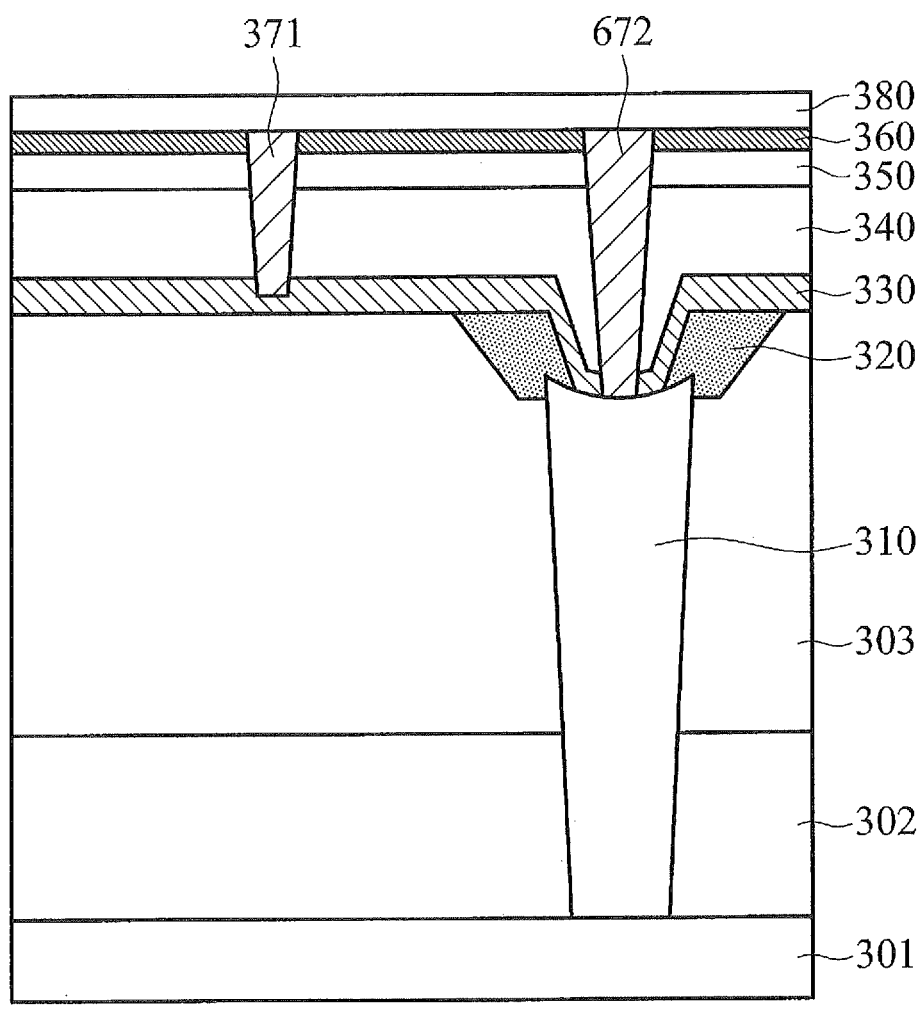
FIG. 7 illustrates a cross-sectional view of yet another exemplary SOI structure for reducing process charging damages, in accordance with some embodiments of the present disclosure.

FIG. 7 illustrates a cross-sectional view of yet another exemplary SOI structure 700 for reducing process charging damages, in accordance with some embodiments of the present disclosure. As shown in FIG. 7, the exemplary SOI structure 700 is similar to the SOI structure 600 described and illustrated with reference to FIG. 6, except that, for example, the polysilicon region 310 in the SOI structure 700 has a concave upper surface. As such, the second contact 672 and/or the CESL 330 formed on and in direct contact with the polysilicon region 310 has a concave shape at its bottom.

In an embodiment, a silicon-on-insulator (SOI) structure is disclosed. The SOI structure includes: a substrate, a polysilicon region and an etch stop layer. The substrate includes: a handle layer, an insulation layer arranged over the handle layer, and a buried layer arranged over the insulation layer. The polysilicon region extends downward through the buried layer and the insulation layer, and terminates in the handle layer. The etch stop layer is located on the substrate. The etch stop layer is in contact with both the substrate and the polysilicon region.

In another embodiment, a semiconductor structure is disclosed. The semiconductor structure includes: a substrate; a polysilicon region extending downward into the substrate; an etch stop layer located on the substrate and in contact with the polysilicon region; and at least one contact located on the etch stop layer.

In yet another embodiment, a method for forming a semiconductor structure is disclosed. The method includes: forming a polysilicon region extending downward into a silicon-on-insulator (SOI) substrate; forming an isolation layer on the polysilicon region; etching the isolation layer to form an opening; and depositing an etch stop layer on the SOI substrate and in contact with the polysilicon region through the opening.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate that includes:
      an insulation layer arranged over the handle layer, and
      a buried layer arranged over the insulation layer;
   a polysilicon region extending downward through the buried layer and the insulation layer; and
   an etch stop layer located on the substrate;
   at least one contact located on the etch stop layer;
   at least one dielectric layer on the etch stop layer, wherein the at least one dielectric layer comprises a first dielectric layer formed on the etch stop layer and a second dielectric layer formed on the first dielectric layer; and
   a metal layer over the at least one dielectric layer.

2. The semiconductor structure of claim 1, wherein the substrate further includes a handle layer, and the polysilicon region terminates in the handle layer.

3. The semiconductor structure of claim 2, wherein the at least one contact comprises tungsten.

4. The semiconductor structure of claim 2, further comprising a third dielectric layer formed on the second dielectric layer.

5. The semiconductor structure of claim 1, further comprising an isolation layer located on the polysilicon region and below the etch stop layer, wherein the isolation layer has an opening through which the etch stop layer is in contact with the polysilicon region.

6. The semiconductor structure of claim 5, wherein the etch stop layer comprises:
   at least one portion located at a bottom of the opening; and
   at least one portion extending along sidewalls of the opening.

7. The semiconductor structure of claim 5, wherein the polysilicon region has a higher electric conductivity than that of the isolation layer.

8. The semiconductor structure of claim 1, further comprising an additional contact located right over the polysilicon region and on the etch stop layer.

9. The semiconductor structure of claim 8, wherein the polysilicon region is configured to provide a deep trench isolation for the semiconductor structure.

10. A semiconductor structure, comprising:
    a substrate;
    a polysilicon region extending into the substrate;
    an etch stop layer located on the substrate and in contact with the polysilicon region; and
    an isolation layer located on the polysilicon region, wherein the isolation layer has an opening through which the etch stop layer is in contact with the polysilicon region,
    wherein the etch stop layer comprises at least one portion located at a bottom of the opening and at least one portion extending along sidewalls of the opening.

11. The semiconductor structure of claim 10, wherein the polysilicon region has a higher electric conductivity than that of the isolation layer.

12. The semiconductor structure of claim 10, wherein a size of the opening is smaller than a size of a top surface of the polysilicon region.

13. The semiconductor structure of claim 10, wherein the polysilicon region is located below the etch stop layer.

14. The semiconductor structure of claim 13, further comprising at least one contact located on the etch stop layer, wherein the at least one contact comprises a contact located over the polysilicon region and on the etch stop layer.

15. The semiconductor structure of claim 14, wherein a size of a bottom surface of the contact is smaller than a size of the opening.

16. The semiconductor structure of claim 14, wherein the etch stop layer electrically connects the at least one contact with the polysilicon region during a charging process.

17. A method for forming a semiconductor structure, comprising:
    providing a substrate;
    forming a polysilicon region that extends at least partially into the substrate;
    forming an isolation layer on the polysilicon region;
    etching the isolation layer to form an opening; and
    depositing an etch stop layer on the substrate and in contact with the polysilicon region through the opening;
    forming at least one dielectric layer on the etch stop layer, wherein the at least one dielectric layer comprises a first dielectric layer formed on the etch stop layer and a second dielectric layer formed on the first dielectric layer; and
    forming a metal layer over the at least one dielectric layer.

18. The method of claim 17, wherein:
    the polysilicon region is formed in a deep trench of the substrate; and
    the isolation layer is formed in a shallow trench above the polysilicon region.

19. The method of claim 17, further comprising:
    forming at least one contact extending downward through the at least one dielectric layer and onto the etch stop layer; and electrically coupling the metal layer to the at least one contact.

20. The method of claim 19, wherein the at least one contact comprises a contact extending into the opening of the isolation layer and located right over the polysilicon region.

* * * * *